(12) United States Patent
Iwata

(10) Patent No.: US 7,390,957 B2
(45) Date of Patent: Jun. 24, 2008

(54) INFORMATION PROCESSING APPARATUS AND SOUND VOLUME CONTROL METHOD

(75) Inventor: Takeshi Iwata, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 11/248,230

(22) Filed: Oct. 13, 2005

(65) Prior Publication Data

US 2006/0196347 A1 Sep. 7, 2006

(30) Foreign Application Priority Data

Mar. 4, 2005 (JP) ............................. 2005-061650

(51) Int. Cl.
*G10H 1/46* (2006.01)

(52) U.S. Cl. ..................... 84/633; 84/665; 381/109; 718/1

(58) Field of Classification Search ............... 84/633, 84/665, 711, 741; 381/109, 119; 718/1, 718/100

See application file for complete search history.

(56) References Cited

U.S. PATENT DOCUMENTS

| 6,256,027 | B1 | 7/2001 | Jeong | |
|---|---|---|---|---|
| 6,791,572 | B1* | 9/2004 | Cloney et al. | 345/619 |
| 6,907,129 | B2* | 6/2005 | Mallinson | 381/106 |
| 2001/0015718 | A1* | 8/2001 | Hinckley et al. | 345/156 |
| 2003/0086683 | A1* | 5/2003 | Morisawa | 386/46 |
| 2006/0236081 | A1* | 10/2006 | Hung et al. | 713/1 |

FOREIGN PATENT DOCUMENTS

| JP | 7-122949 | 5/1995 |
|---|---|---|
| JP | 2002-335137 | 11/2002 |

* cited by examiner

*Primary Examiner*—Lincoln Donovan
*Assistant Examiner*—David S. Warren
(74) *Attorney, Agent, or Firm*—DLA Piper US LLP

(57) ABSTRACT

An information processing apparatus comprises an operating member used for changing a sound volume, a display device which displays volume data of the sound volume changed in response to an operation of the operating member and a controller which changes the volume data. An indicator indicates level data changed in response to the operation of the operating member.

16 Claims, 9 Drawing Sheets

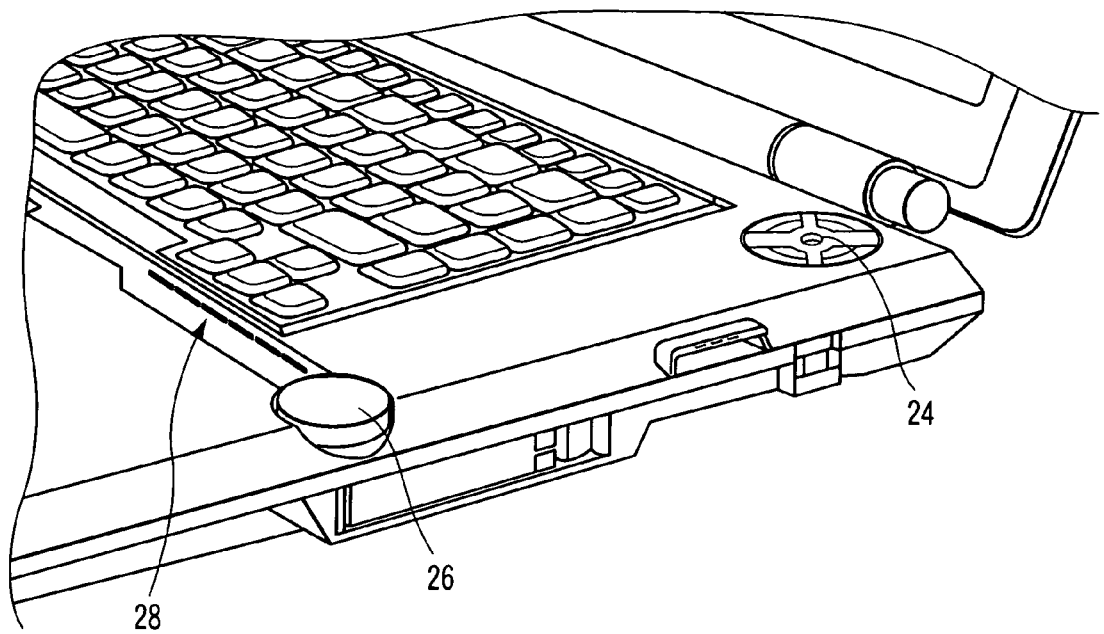
FIG. 2
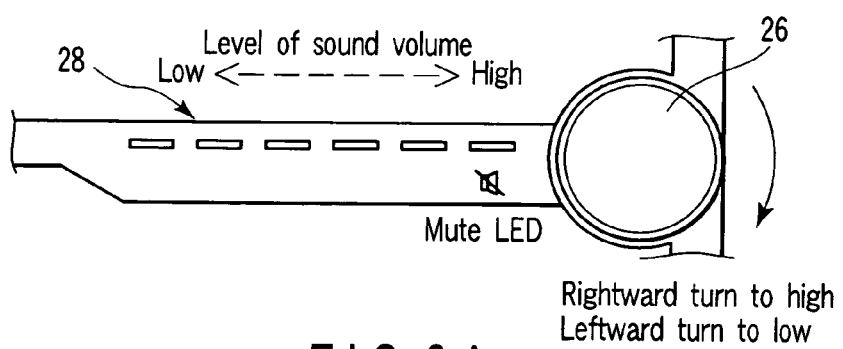
FIG. 3A
FIG. 3B

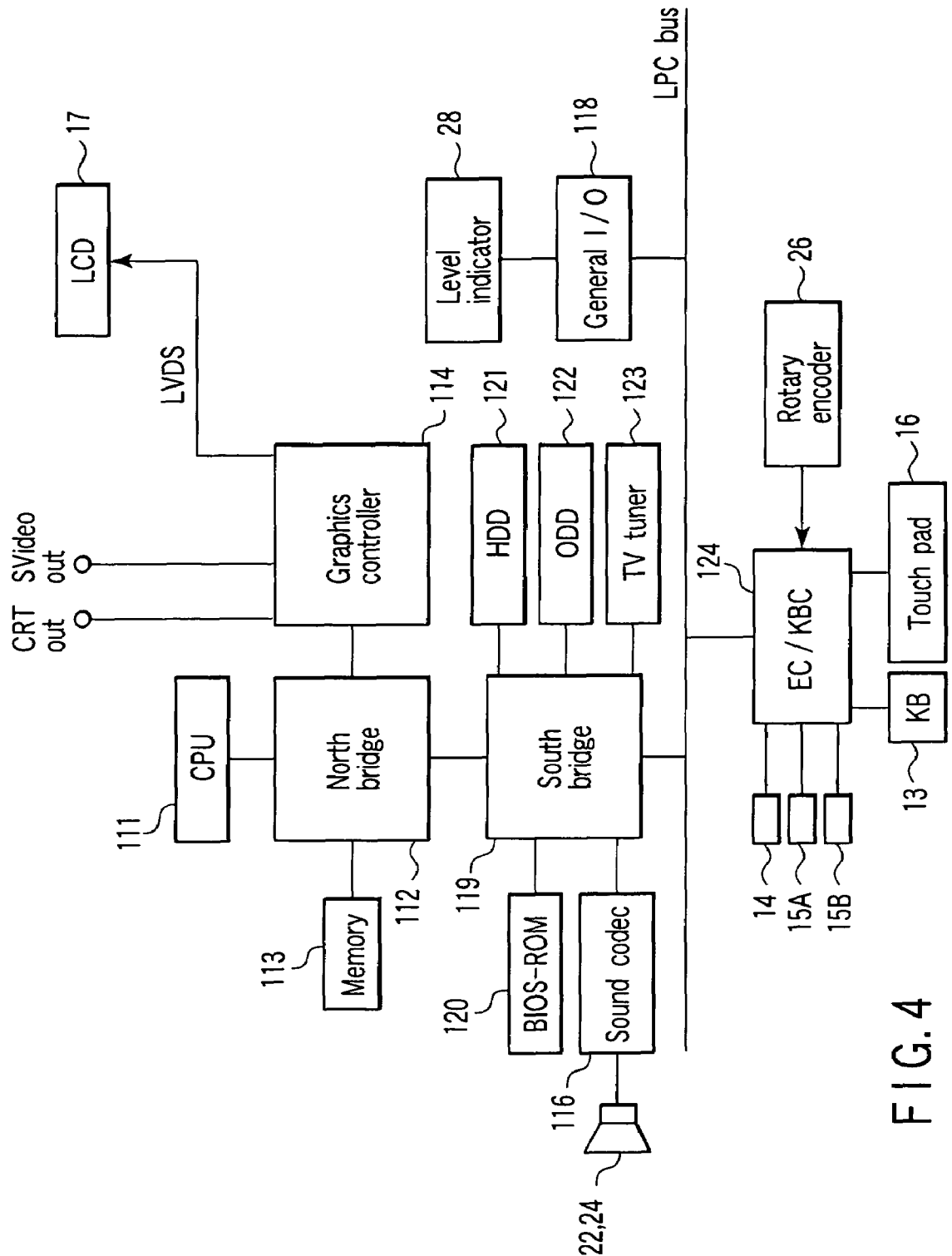
F I G. 4

INFORMATION PROCESSING APPARATUS AND SOUND VOLUME CONTROL METHOD

CROSS-REFERENCE TO RELATED APPLICATIONS

This application is based upon and claims the benefit of priority from the prior Japanese Patent Application No. 2005-61650, filed Mar. 4, 2005, the entire contents of which are incorporated herein by reference.

BACKGROUND

1. Field

Embodiments of the present invention relate to an information processing apparatus having a function of playing back sound and a sound volume control method for use in the information processing apparatus.

2. Description of the Related Art

In recent years, a type of personal computer has been developed having an AV playback function which enables audio and video (AV) apparatuses including compact disk (CD) players, digital versatile disk (DVD) players, and TV receivers to be played back through the computer.

For example, Japanese Patent Publication (KOKAI) 2002-335137 (paragraphs 0002 to 0005) discloses an audio apparatus which is connectable with a computer. The computer can execute application software to play back sound from audio data stored in the computer and control the volume of the sound. GUI (graphic user interface) software provided by an OS (operation system) or the application software is used for controlling the volume of the sound. Also, pointing devices such as a mouse, a track ball or the like is used as typical input devices. The GUI displays a rotary volume knob or a sliding volume knob or the like.

This allows a user to manipulate the pointing devices such as the mouse and to drag the cursor for turning or sliding the volume knob displayed on the operating screen of the GUI. Accordingly, the sound amplitude of the audio apparatus can be controlled by the user operating the control on the display screen.

However, a problem is that the conventional volume control adjustment using the GUI is not performed until application software is started.

BRIEF DESCRIPTION OF THE SEVERAL VIEWS OF THE DRAWINGS

The accompanying drawings, which are incorporated in and constitute a part of the specification, illustrate embodiments of the present invention and in which:

FIG. 2 is a view showing an arrangement of a rotary encoder of the personal computer;

FIG. 3A is a diagram showing an indication form of a level indicator of the personal computer;

FIG. 3B is a diagram showing a relationship between level data of sound volume and the indication of the level indicator;

FIG. 4 is a block diagram showing a system arrangement of the personal computer;

DETAILED DESCRIPTION OF SEVERAL EMBODIMENTS

Various embodiments of an information processing apparatus according to the present invention will now be described with reference to the accompanying drawings. The information processing apparatus is implemented in the form of a notebook type personal computer 10. Of course, other embodiments of an information processing apparatus may include, but are not limited or restricted to a desktop computer, a personal digital assistant (PDA) or any type of portable computer.

Figure 1:
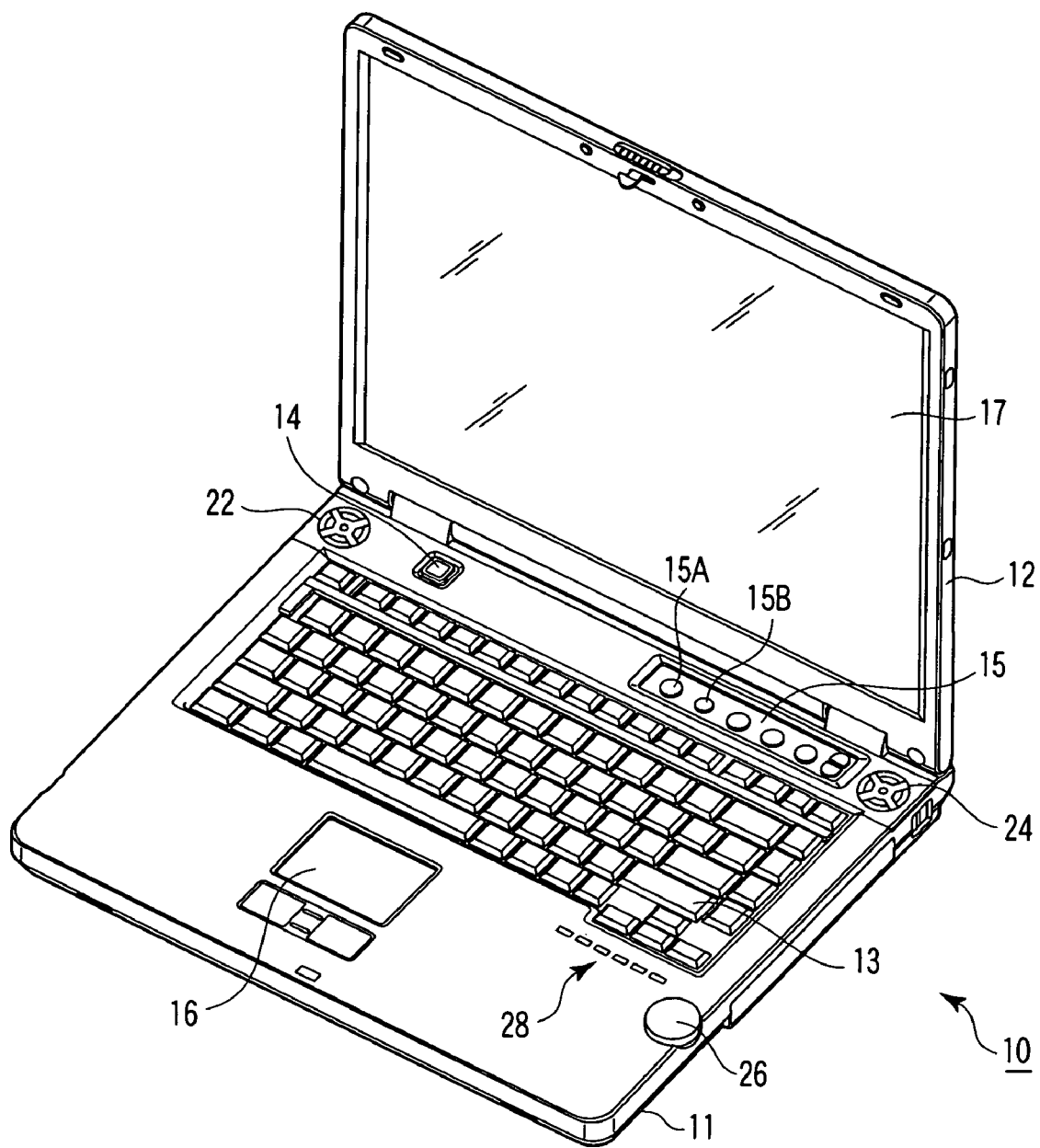
FIG. 1 is a perspective view showing an external appearance of a personal computer according to an embodiment of the present invention.

FIG. 1 is a view showing a notebook type personal computer 10 with the display unit open. The personal computer 10 includes a computer main body 11 and the display unit 12. The display unit 12 has a liquid crystal display (LCD) 17. The screen of the LCD 17 is located at substantially the center of the display unit 12. The screen of the LCD 17, for example, may be sized at an aspect ratio of 16:9 for displaying a high-definition (HD) image.

The display unit 12 is rotatably mounted to the computer main body 11 for movement between the opening position and the closed position. The computer main body 11 has a housing of a box-like shape. The top surface of the housing has a keyboard 13, a power button switch 14 for switching the personal computer 10 on and off, an entry operation panel 15, a touch pad 16 or the like. Also, left and right loudspeakers 22 and 24 is provided at the upper side of the keyboard 13. A rotary encoder 26 is provided at the lower right side of the keyboard 13 for controlling the sound volume. A level indicator 28 is provided at the left side of the rotary encoder 26 for indicating the sound volume level data.

As shown in FIG. 2, slope is formed at the periphery of the housing of the computer main body 11. The rotary encoder 26 partially extends outwardly of the slope so that it can be turned by a finger touching the extending end. The rotary encoder 26 may be turned by a fingertip pressing the upper face.

The rotary encoder 26 is arranged rotatable in both, clockwise and counter-clockwise, directions. When one full turn of the rotary encoder 26 is divided into twelve steps, each $\frac{1}{12}$ turn generates a two-phase clock signal (pulse signal) indicative of the direction of turning and the sound volume level data. The two-phase clock signal indicates the direction of turning with the phase relationship between the two clock signals and the number of click actions (an angle of turning) with the number of pulses. In this embodiment, the sound volume level data is increased by turning encoder 26 in the clockwise direction and decreased by turning encoder 26 in the counter-clockwise direction. It is also noted that the $\frac{1}{12}$ turn of the rotary encoder 26 is called one click action.

The rotary encoder 26 can be turned any number of times. The level data of sound volume is however limited between the maximum and the minimum. When the sound volume level data reaches the maximum or minimum, the output signal from the rotary encoder 26 commanding a change in the sound volume level data will be disabled so that the level data of sound volume remains at the maximum or minimum.

FIGS. 3A and 3B illustrate a function of the level indicator 28. As shown in FIG. 3A, the level indicator 28 includes a horizontal single line of six LEDs provided at the left side of the rotary encoder 26. Level indicator 28 can indicate the sound volume level data with the number of illuminated LEDs. The higher the sound volume level data is, the greater the number of LEDs which are illuminated (from left to right). The clockwise turning of the rotary encoder 26 increases the sound volume level data. The counter-clockwise turning of the rotary encoder 26 reduces the sound volume level data. Provided at the lower right side of the level indicator 28 is an icon for muting. When the mute mode is selected, the icon is illuminated by a back light to indicate that no sound is allowed to be generated.

FIG. 3B illustrates a relationship between the sound volume level data and the number of LEDs which are illuminated (denoted by hatched squares for simplicity). The sound volume level data ranges from the maximum of 25 to the minimum of 0 where no LED are illuminated. When the sound volume level data is from 1 to 5, the leftmost LED is illuminated. Similarly, when the sound volume level data is from 6 to 10, the two leftmost LEDs are illuminated. When the sound volume level data is from 11 to 15, the three leftmost LEDs are illuminated. When the sound volume level data is from 16 to 20, the four leftmost LEDs are illuminated. When the sound volume level data is from 21 to 24, the five leftmost LEDs are illuminated. When the sound volume level data is 25 (at the maximum), all of the LEDs are illuminated.

The mounting position of the rotary encoder 26 and the level indicator 28 is not limited to the above described arrangement but may be at any appropriate place on the computer main body 11. The arrangement of the LEDs of the level indicator 28 is not limited to a horizontal single line but may be in any shape such as in a vertical single line or an circular graph shape.

A system arrangement of the personal computer 10 will be described referring to FIG. 4.

The personal computer 10 includes, as shown in FIG. 4, a CPU 111, a north bridge 112, a main memory 113, a graphics controller 114, a south bridge 119, a BIOS-ROM 120, a sound codec 116, a hard disk drive (HDD) 121, an optical disk drive (ODD) 122, a TV tuner 123, and embedded controller/keyboard controller IC (EC/KBC) 124.

The CPU 111 is a processor for controlling the operation of the personal computer 10 and executing an operation system (OS) and various application programs loaded from the hard disk drive (HDD) 121 to the main memory 113. The OS displays applicable windows on the screen.

Motion image data (for example, a TV broadcast program data received by the TV tuner 123 or a video content stored in a storage medium such as a DVD) is commonly displayed in the window corresponding to a video playback application program. The window for the video playback application program is positioned on the LCD display screen 17 for displaying a motion image data (in a window mode). The personal computer 10 also allows the motion image data to be displayed in a full screen mode on the LCD display screen 17. The full area of the screen is almost entirely filled with the motion image data in the full screen mode. In the latter case, no more windows are displayed except the desk top page or the window corresponding to the video playback application program. While the screen is almost fully filled up with the motion image data, the menu bar of the window corresponding to the video playback application program is not displayed.

The CPU 111 executes a system BIOS (basic input/output system) stored in the BIOS-ROM 120. The system BIOS is a program to control the action of hardware.

The north bridge 112 is a bridge device for connecting a local bus of the CPU 111 and the south bridge 119. The north bridge 112 includes a memory controller for controlling access to the main memory 113. The north bridge 112 also controls communications via an AGP (accelerated graphics port) with the graphics controller 117.

The graphics controller 114 is the display controller for LCD 17 for the personal computer 10. The graphics controller 114 has a video memory (VRAM) for reproducing a video signal from the display data written in the video memory by the OS and application programs to generate the display image to be displayed on the LCD 17. In general, the screen image consists mainly of the image of the desk top page and of window(s) on the desk top page. In the full screen mode, the display image on the LCD 17 is constructed from only the motion image data. Accordingly, when an image of the motion image data is displayed in the full screen mode, the video signal forming only the display image of motion image data is output from the graphics controller 114.

The video signal generated by the graphics controller 114, for example, the signal composed by low voltage differential signal (LVDS) format is applied to the LCD 17. The graphics controller 114 also has an interface to output an analog video signal to an external cathode ray tube (CRT) and another interface to output an analog video signal via an S video port to the outside.

The south bridge 119 is provided for controlling each device on the LPC (low pin count) bus. The south bridge 119 includes an IDE (integrated drive electronics) controller to control both the HDD 121 and the ODD 122. The south bridge 119 also controls the TV tuner 123 and controls access to the BIOS-ROM 120.

The optical disk drive (ODD) 122 is a drive unit to drive a recording medium such as a DVD or a CD on which video content is recorded. The TV tuner 123 receives broadcast data including TV programs.

The LPC bus is connected with a general interface 118. The general interface 118 is in turn connected to the level indicator 28 and includes a register for saving data to control the level indicator 28.

The embedded controller/keyboard controller IC (EC/KBC) 124 is a single-chip microcomputer which has an embedded controller to control power to personal computer 10 and a keyboard controller to control the action of the keyboard (KB) 13 and the touch pad 16 integrated in a chip.

The embedded controller/keyboard controller IC (EC/KBC) 124 has a function of switching the personal computer 10 on and off in response to the user operating the power button switch 14. The embedded controller/keyboard controller IC (EC/KBC) 124 is also connected with the rotary encoder 26.

Figure 6:
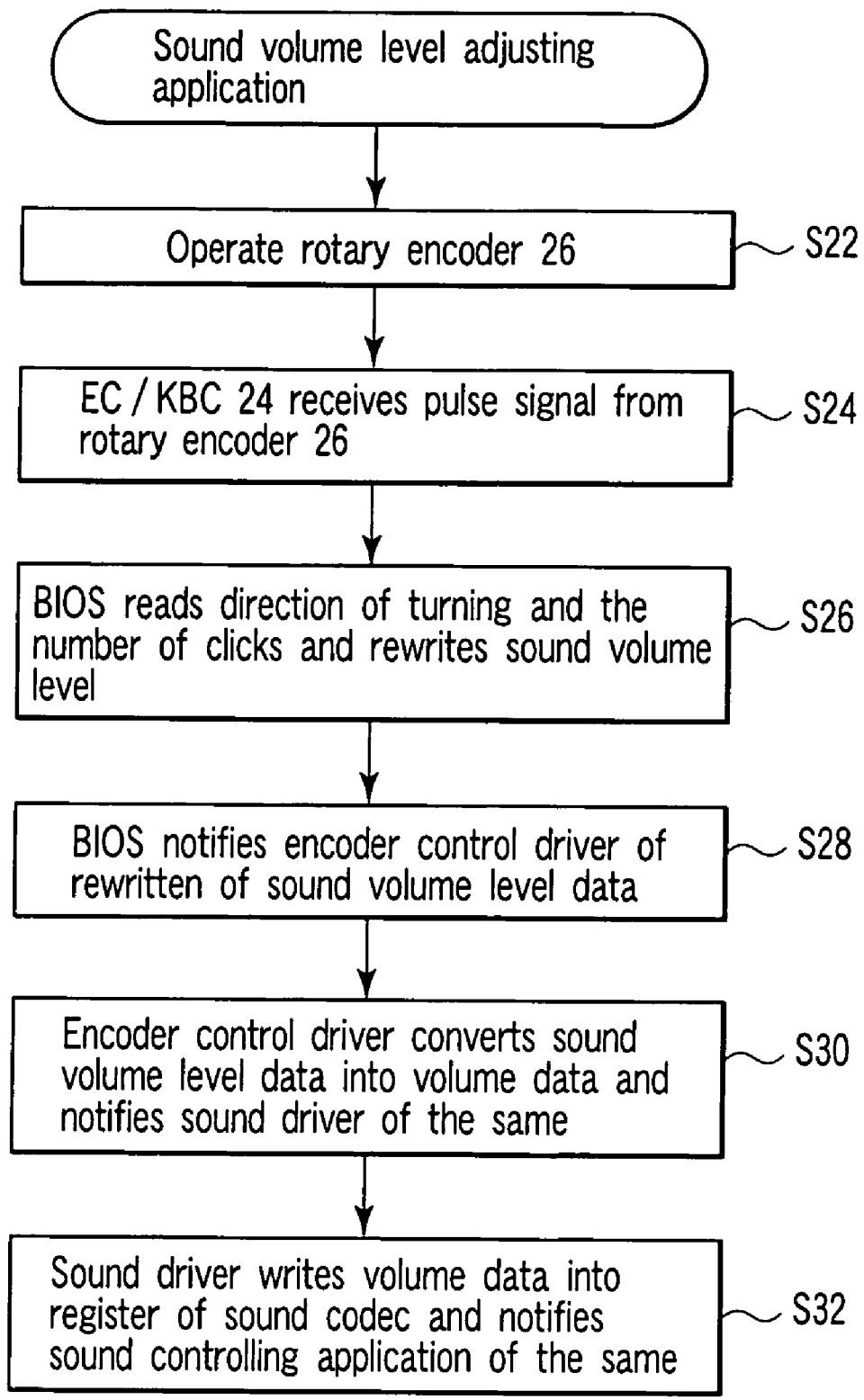
FIG. 6 is a flowchart showing another example of a sound controlling process of the personal computer.
Figure 7:
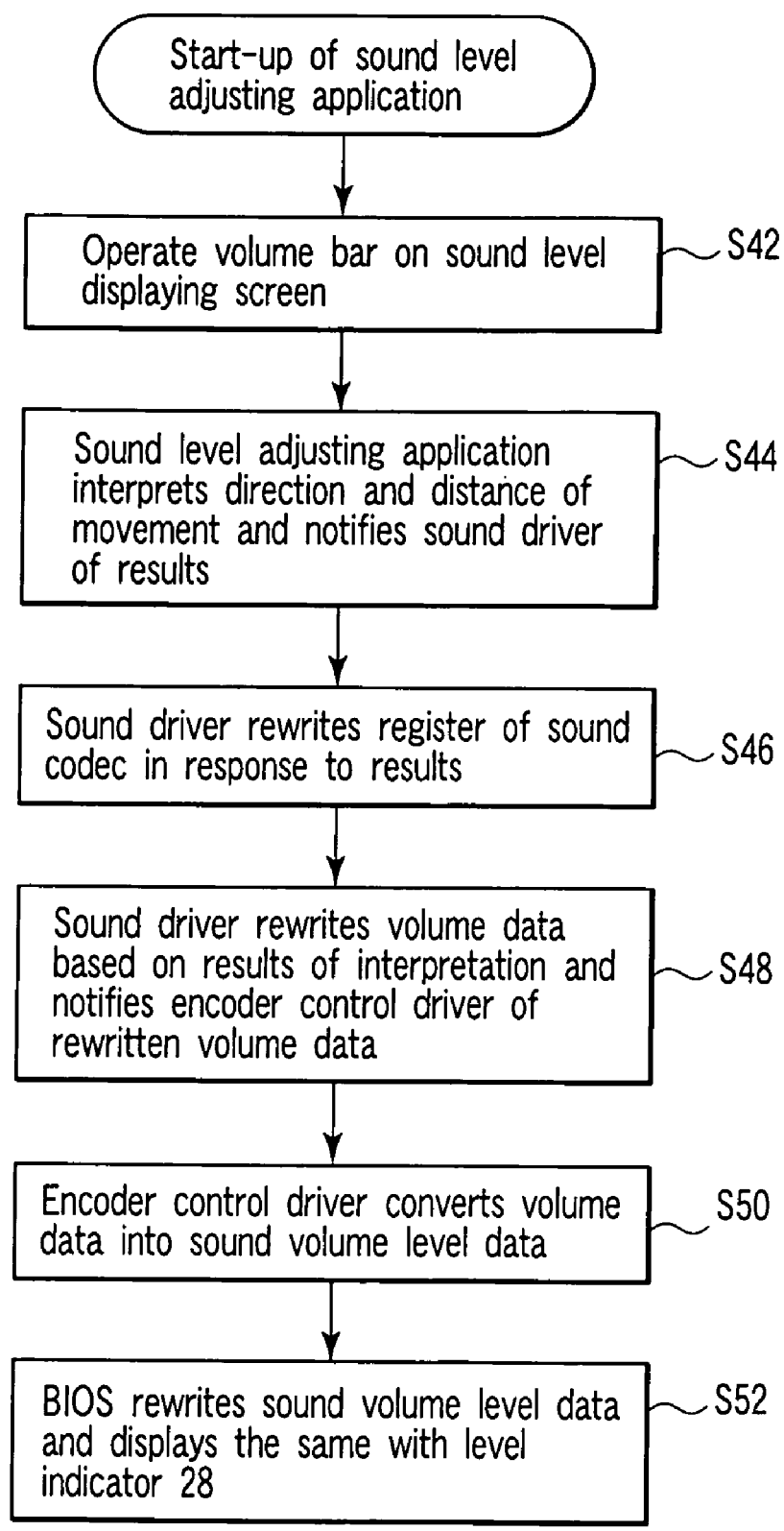
FIG. 7 is a flowchart showing still another example of a sound controlling process of the personal computer.

The process of controlling the sound volume level data by the personal computer 10 will now be described referring to the flowcharts of FIGS. 5 to 7, the functional block diagrams of FIGS. 8 and 9, and the sound volume level data/volume characteristic graph of FIG. 10.

Figure 5:
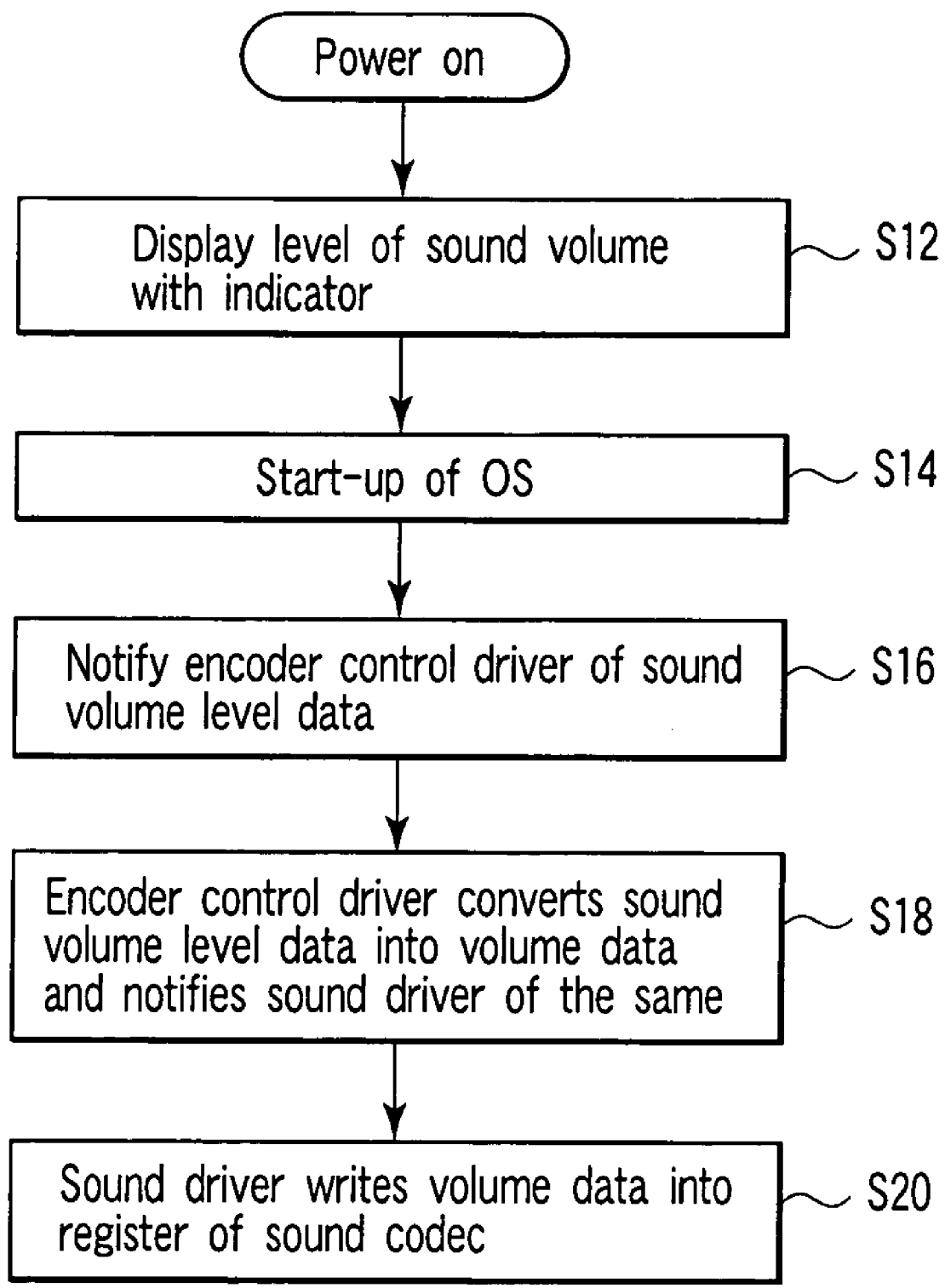
FIG. 5 is a flowchart showing one example of a sound controlling process of the personal computer.

A process at the time of power-on is described referring to FIG. 5. When the personal computer 10 is turned on by the user operating the power button switch 14, the CPU 111 executes the BIOS 200 (Step S12 and FIGS. 8 and 9). The CPU 111 executes the BIOS 200 to read out sound volume level data which has been stored in a non-volatile memory such as flash memory (as set prior to the power having been turned off previously). Simultaneously, the CPU 111 executes the BIOS 200 to display the sound volume level data on the level indicator 28.

Figure 8:
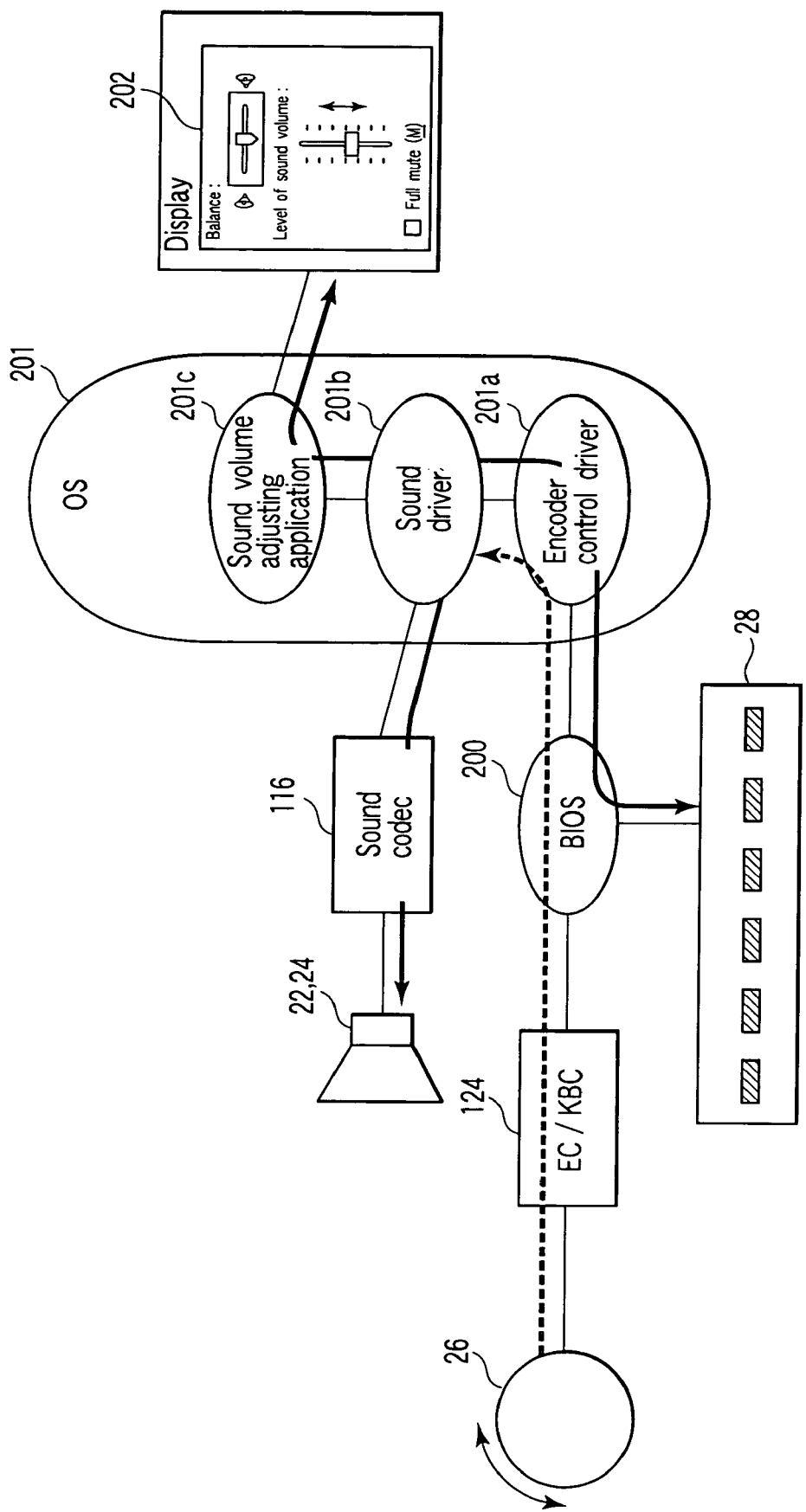
FIG. 8 is a functional block diagram showing still another example of a sound controlling process of the personal computer.
Figure 9:
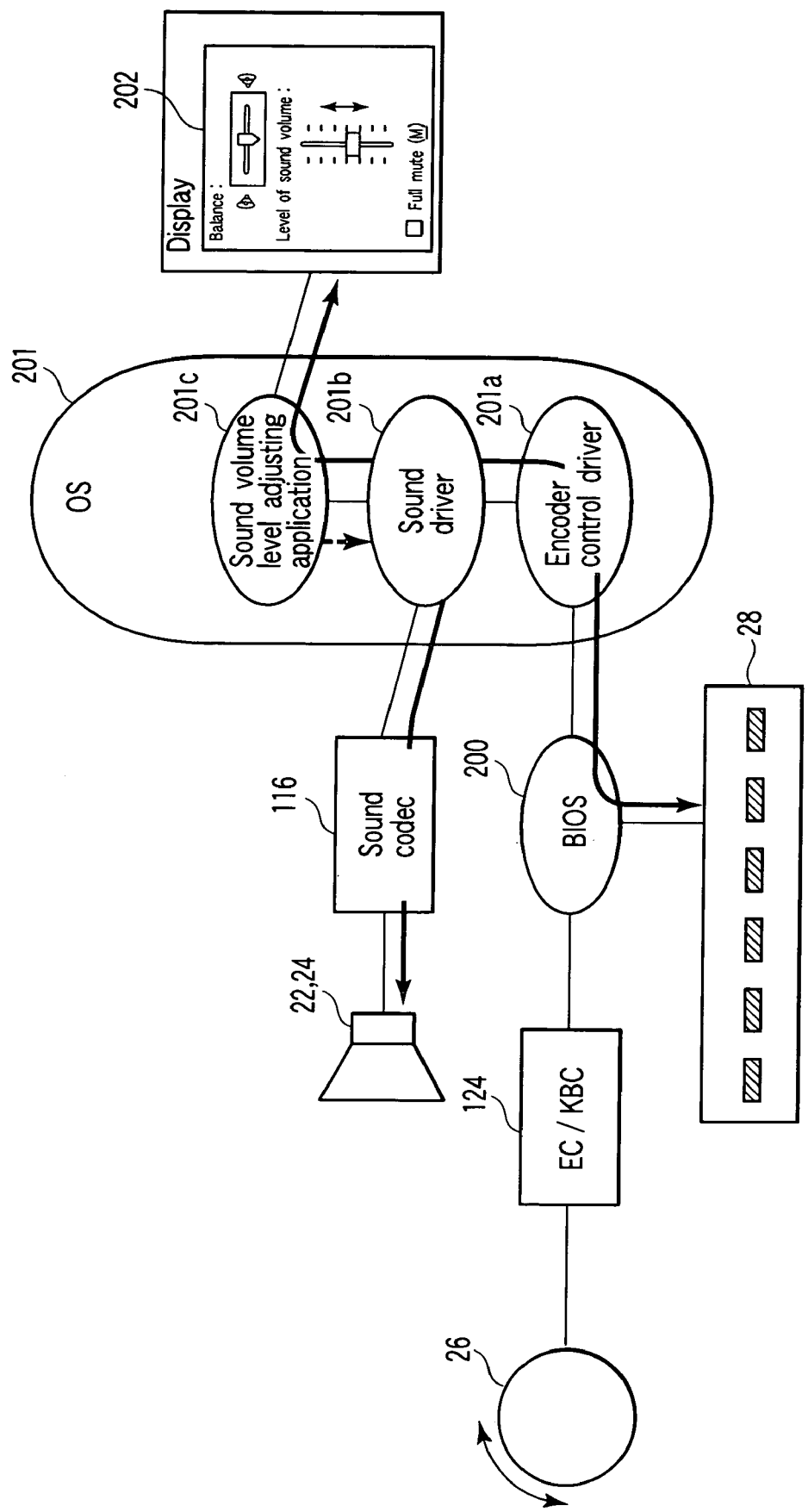
FIG. 9 is a functional block diagram showing still another example of a sound controlling process of the personal computer.

This allows the user to visibly read and acknowledge the sound volume level on the level indicator 28 prior to the startup of the OS 201 (See FIGS. 8 and 9). Accordingly, the sound volume level can arbitrarily be modified, when needed, to a desired level by the user controlling the rotary encoder 26 in a manner described later. The sound volume level data set by the user is then stored in the non-volatile memory such as flash memory (for example, the BIOS-ROM 120).

Since the sound volume level data is controlled by the user prior the startup of the OS 201, the sound volume level is prevented from being undesirably large at the startup of the OS 201.

The OS 201 is started by the BIOS 200 (Step S14). At the time, in the audio playback mode, sound will be produced at the desired level (adjusted if needed).

Then, the sound volume level data stored in the non-volatile memory is transferred to the OS 201 by the BIOS 200 (Step S16). As the OS 201 includes an encoder control driver 201a, a sound driver 201b, and a volume level adjusting application 201c, the sound volume level data is received by the encoder control driver 201a.

The encoder control driver 201a then converts the sound volume level data ranging from 0 to 26 into volume data (Step S18). The conversion from the sound volume level data to the volume data or from the volume data to the sound volume level data is carried out depending on the graphic profile shown in FIG. 10.

Figure 10:
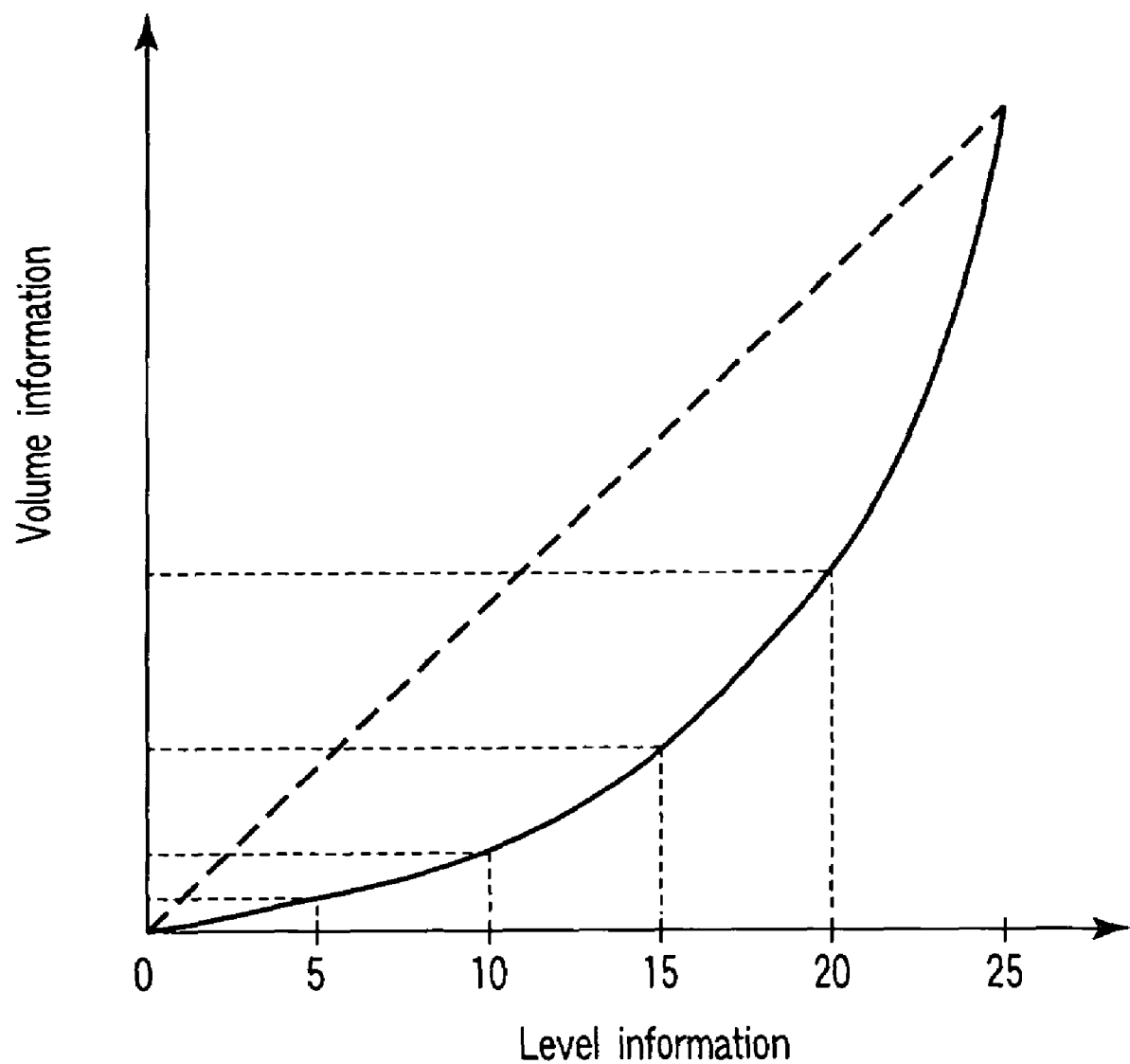
FIG. 10 is a diagram showing a relationship between the level data of sound volume and volume data.

The solid line in FIG. 10 represents the relationship between the sound volume level data and the volume data. In the relationship, as the sound volume level data increases by a given rate, the volume data does not increase by the same rate. Thus, the volume data is increased by a smaller rate at a lower range than at a higher range of the sound volume level data. More specifically, the volume data is increased exponentially when the sound volume level data increases linearly.

This permits the user to fine-turn the sound volume level data much easier at the lower range, as compared with the proportional relationship denoted by the dotted line in FIG. 10 where the volume data is increased proportionally as the sound volume level data increases. In fact, the range of sound used during the playback of audio will stay frequently at the lower range. Accordingly, in this embodiment controlling the sound to a desired or ear friendly level is easy.

The encoder control driver 201a notifies the sound driver 201b of the volume data.

The sound driver 201b then sets the volume data into a register in the sound codec 116 (Step S20). Accordingly, the sound played back by the sound codec 116 will correspond to the sound volume level data.

An interrupting process performed when the rotary encoder 26 is turned after the OS 201 and the ground level adjusting application 201c have started will be described referring to FIGS. 6 and 8. When the rotary encoder 26 is manipulated by the user (Step S22), the two-phase clock signal (pulse signal) indicative of the turning direction and the number of clicks is received by the EC/KBC 124 (Step S24). The turning direction and the number of clicks are set in a register in the EC/KBC 124.

Upon receiving the clock signal, the EC/KBC 124 also notifies the BIOS 200 of a system management interrupt (SMI) mode. In turn, the BIOS 200 executes the SMI process to read out the above data set in the register in the EC/KBC 124.

The BIOS 200 sets the level data of sound volume based of the turning direction and the number of clicks in the non-volatile memory (Step S26).

The sound volume level data set at Step S26, is then provided by the BIOS 200 to the encoder control driver 201a (Step S28).

The encoder control driver 201a converts the sound volume level data into volume data with the use of the sound level/volume characteristic data as shown in FIG. 10 and notifies the sound driver 201b of the volume data (Step S30).

The sound driver 201b sets the volume data in the register in the sound codec 116 and notifies the sound level adjusting application 201c of the volume data (Step S32). The sound level adjusting application 201c displays on a sound level display screen 202 of the LCD 17 a value of sound to be played back by the sound codec 116 as having been determined from the volume data.

Accordingly, when the rotary encoder 26 is manipulated, it updates the sound volume level data managed by the BIOS 200 and thus updates the indication of the level indicator 28 as well as the volume data managed by the OS 201. This allows the sound codec 116 to reproduce a modified sound volume along with the modified level display on the LCD 17.

The rotary encoder 26 is also operable before the startup of the OS 201. In that case, the sound volume level data stored in the non-volatile memory is updated by the BIOS 200 and displayed on the level indicator 28. The level data of sound volume is then transferred from the BIOS 200 to the encoder control driver 201a after the startup of the OS 201 as shown in FIG. 5.

In one embodiment the sound volume level data is modified with each click of rotary encoder 26. In another embodiment the sound volume level data is updated based on the total number of clicks generated by rotary encoder 26 after rotation of rotary encoder 28 stops. The EC/KBC 28 saves the data about the direction of turning in the register the EC/KBC 28 after Step S24. Step S26 follows where the sound volume level data generated based on the direction of turning is set in the non-volatile memory by the BIOS 200.

Adjustment of the sound volume using the sound volume level adjusting application 201c controlling the sound volume level data will be described referring to FIGS. 7 and 9. When the level control bar in the sound level display screen 202 is manipulated by a user (Step S42), the movement direction and distance is examined and interpreted by the sound level adjusting application 201c which in turn notifies the sound driver 201b of an adjusting instruction (Step S44).

In response to the adjusting instruction, the sound driver 201b updates the volume data in the register of the sound codec 116 (Step S46).

The sound driver 201b then notifies the encoder control driver 201a of the update of the volume data (Step S48) after updating the volume data in response to the adjusting instruction.

The encoder control driver 201a converts the volume data into sound volume level data with the use of sound level/volume characteristic data as shown in FIG. 10 (Step S50).

After a BIOS sub routine has been called by the encoder control driver 201a, the BIOS 200 updates the sound volume level data stored in the non-volatile memory in response to the updated sound volume level data and causes the level indicator 28 to display the updated level (Step S52).

As the sound level adjusting bar on the sound level adjusting screen 202 is moved using a mouse, the sound codec 116 modifies the level of sound played back and updates the sound volume level data managed by the BIOS 200 as well as the indication of the level on indicator 28.

The present invention is not limited to the foregoing embodiments but may be changed or modified in the actual arrangement without departing from the scope of the present invention. Various inventions are made by any proper combination with the disclosed components in the above embodiments. For example, some components may be omitted from the components described in the embodiments. Also, the components may be assembled in different groups.

The operating means for generating a sound level modification commanding signal is not limited to the rotary encoder 26 but may be implemented by any applicable device, such as a zooming switch which can produce two different polarity pulses. The rotary encoder 26 creates no mechanical sound when being operated or turned and will be unfavorable for operation with physical sensitivity. If desired, the turning operation of the rotary encoder 26 may be accompanied with a small corresponding electronic sound. Also, the rotary encoder 26 may be used as not a volume controller but an input device for scrolling the relevant display screen with the note-book personal computer of the embodiment shifted into a corresponding action mode.

What is claimed is:

1. An information processing apparatus comprising:
    an operating member configured to set level data;
    an indicator configured to indicate the level data;
    a basic input/output system configured to supply the level data set by the operating member to the indicator to display the level data set by the operating member such that the level data can be adjusted by using the operating member before an operating system starts; and
    sound adjusting software configured to convert the set level data into volume data, the sound adjusting software being operational after the operating system starts;
    a display screen configured to display the volume data, wherein the sound adjusting software enables a volume controller to adjust the volume data on the display screen.

2. An information processing apparatus according to claim 1, further comprising:
    a codec which generates sound based on the volume data generated by the sound adjusting software; and
    a loudspeaker which outputs the sound which is generated by the codec.

3. An information processing apparatus according to claim 1, wherein the indicator indicates the level data changed in response to an operation of the operating member.

4. An information processing apparatus according to claim 1, further comprising:
    a non-volatile memory which stores the level data set by the operating member, wherein the basic input/output system causes the indicator to indicate the level data stored in the non-volatile memory.

5. An information processing apparatus according to claim 1, wherein the basic input/output system causes the indicator to indicate the level data stored in the non-volatile memory before activating the sound adjusting software.

6. An information processing apparatus according to claim 1, wherein the sound adjusting software converts the level data set by the operating member into the volume data based on an exponential conversion characteristic.

7. An information processing apparatus according to claim 1, wherein the sound adjusting software converts the volume data generated in response to an operation of the volume controller into the level data, and the indicator indicates the level data generated by the sound adjusting software.

8. An information processing apparatus according to claim 7, further comprising:
    a codec which generates sound based on the volume data changed in response to an operation of the volume controller; and
    a loudspeaker which outputs the sound which is generated by the codec.

9. An information processing apparatus according to claim 7, wherein the sound adjusting software converts the volume data generated in response to an operation of the volume controller into the level data based on an exponential conversion characteristic, and the indicator indicates the level data generated by the sound adjusting software.

10. A sound volume control method comprising:
    setting level data by an operating member;
    starting a basic input/output system:
    supplying the level data set by the operating member to an indicator using the basic input/output system to display the set level data by the indicator such that the level data can be adjusted by using the operating member before an operating system starts;
    starting the operating system to start an adjusting software;
    converting, via sound adjusting software, the level data into volume data; and
    displaying, via sound adjusting software, the volume data and a volume controller which can change the volume data on a display screen.

11. A sound volume control method according to claim 10, further comprising:
    generating sound based on the volume data generated by the sound adjusting software.

12. A sound volume control method according to claim 10, further comprising writing the level data set by the operating member into a non-volatile memory, and wherein the indicating comprises indicating the level data stored in the non-volatile memory.

13. A sound volume control method according to claim 12, wherein the indicating comprises indicating the level data stored in the non-volatile memory before initiating the sound adjusting software.

14. A sound volume control method according to claim 10, wherein the indicating comprises indicating the level data in accordance with the volume data generated by the sound adjusting software in response to an operation of the volume controller.

15. A sound volume control method according to claim 10, wherein the sound adjusting software converts the volume data generated in response to an operation of the volume controller into the level data based on an exponential conversion characteristic, and the indicating comprises indicating the level data generated by the sound adjusting software.

16. A sound volume control method according to claim 10, further comprising generating a sound based on the volume data generated in response to an operation of the volume controller.

* * * * *